United States Patent
Cho et al.

(10) Patent No.: US 8,890,294 B2
(45) Date of Patent: Nov. 18, 2014

(54) STACK SEMICONDUCTOR PACKAGE AND MANUFACTURING THE SAME

(71) Applicant: Samsung Electronics Co., Ltd., Gyeonggi-do (KR)

(72) Inventors: Yun-Rae Cho, Seoul (KR); Tae-Hoon Kim, Gyeonggi-do (KR); Ho-Geon Song, Gyeonggi-do (KR); Seok-Won Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/771,609

(22) Filed: Feb. 20, 2013

(65) Prior Publication Data

US 2013/0328177 A1    Dec. 12, 2013

(30) Foreign Application Priority Data

Jun. 7, 2012  (KR) .................. 10-2012-0061135

(51) Int. Cl.
| | |
|---|---|
| *H01L 23/522* | (2006.01) |
| *H01L 21/56* | (2006.01) |
| *H01L 23/552* | (2006.01) |
| *H01L 23/00* | (2006.01) |
| *H01L 23/31* | (2006.01) |

(52) U.S. Cl.
CPC ..... *H01L 21/565* (2013.01); *H01L 2224/92247* (2013.01); *H01L 2924/15311* (2013.01); *H01L 21/568* (2013.01); *H01L 2224/48091* (2013.01); *H01L 23/552* (2013.01); *H01L 2224/73267* (2013.01); *H01L 2224/32145* (2013.01); *H01L 23/3128* (2013.01); *H01L 24/19* (2013.01); *H01L 2224/73265* (2013.01)
USPC .......................................... 257/659; 257/698

(58) Field of Classification Search
USPC .................................................. 257/659, 698
See application file for complete search history.

(56) References Cited

U.S. PATENT DOCUMENTS

| | | | |
|---|---|---|---|
| 6,383,838 B2 | 5/2002 | Ryu | |
| 6,838,761 B2 * | 1/2005 | Karnezos | ...................... 257/685 |

(Continued)

FOREIGN PATENT DOCUMENTS

| | | |
|---|---|---|
| JP | 08-070094 | 3/1996 |
| KR | 100737217 | 7/2007 |

(Continued)

OTHER PUBLICATIONS

Sinnadurai, N "Advanced fillers for electronics encapsulation and electro-magnetic compatibility (EMC)" Proc. of the 56th Elec. Comp. and Tech. Conf. 2006, Jun. 2, 2006 pp. 1802-1807.*

*Primary Examiner* — Yu-Hsi D Sun
*Assistant Examiner* — Grant Withers
(74) *Attorney, Agent, or Firm* — F. Chau & Associates, LLC

(57) ABSTRACT

To manufacture a stack semiconductor package, a board mold covers a first semiconductor. The board mold includes a first face and a second face opposite to the first face. An active surface of the first semiconductor faces the second face. A first opening is formed in the board mold from the second surface. The first opening is disposed on the first semiconductor. A second opening penetrates the board mold from the first surface. A conductive metal layer fills the first and the second openings using an electroless plating method. A plurality of semiconductor devices is stacked on the first face of the board mold.

6 Claims, 8 Drawing Sheets

(56) References Cited

U.S. PATENT DOCUMENTS

| | | | |
|---|---|---|---|
| 6,982,488 B2* | 1/2006 | Shin et al. | 257/777 |
| 7,045,899 B2 | 5/2006 | Yamane et al. | |
| 7,294,920 B2* | 11/2007 | Chen et al. | 257/698 |
| 7,821,108 B2* | 10/2010 | Hollis | 257/621 |
| 7,829,992 B2* | 11/2010 | Sugino et al. | 257/686 |
| 8,164,171 B2* | 4/2012 | Lin et al. | 257/686 |
| 2004/0113254 A1* | 6/2004 | Karnezos | 257/686 |
| 2004/0119153 A1* | 6/2004 | Karnezos | 257/686 |
| 2007/0246813 A1* | 10/2007 | Ong et al. | 257/686 |
| 2008/0237883 A1 | 10/2008 | Tago et al. | |
| 2009/0239336 A1 | 9/2009 | Lee et al. | |
| 2010/0109138 A1* | 5/2010 | Cho | 257/686 |
| 2010/0244208 A1* | 9/2010 | Pagaila et al. | 257/659 |
| 2010/0244219 A1* | 9/2010 | Pagaila et al. | 257/686 |
| 2011/0147901 A1* | 6/2011 | Huang et al. | 257/660 |
| 2011/0215448 A1* | 9/2011 | Cho et al. | 257/659 |
| 2011/0227209 A1* | 9/2011 | Yoon et al. | 257/686 |
| 2011/0291283 A1* | 12/2011 | Chi et al. | 257/773 |
| 2011/0304015 A1* | 12/2011 | Kim et al. | 257/532 |
| 2013/0020685 A1* | 1/2013 | Kwak et al. | 257/659 |
| 2013/0214396 A1* | 8/2013 | Kim | 257/659 |
| 2014/0077344 A1* | 3/2014 | Pagaila et al. | 257/659 |
| 2014/0077382 A1* | 3/2014 | Kwon et al. | 257/773 |

FOREIGN PATENT DOCUMENTS

| | | |
|---|---|---|
| KR | 1020090118438 | 11/2009 |
| KR | 1020110077215 | 7/2011 |
| KR | 1020110114165 | 10/2011 |

* cited by examiner

STACK SEMICONDUCTOR PACKAGE AND MANUFACTURING THE SAME

CROSS-REFERENCE TO RELATED APPLICATION

This application claims priority under 35 U.S.C §119 to Korean Patent Application No. 10-2012-0061135, filed on Jun. 7, 2012, in the Korean Intellectual Property Office, the disclosure of which is incorporated by reference herein in its entirety.

TECHNICAL FIELD

The present inventive concept relates to a stack semiconductor package and a method of manufacturing the same, and more particularly, to a stack memory package for a mobile device and a method of manufacturing the same.

DISCUSSION OF RELATED ART

Recent electronic systems such as mobile devices tend to reduce the number of components, combining various functional chips in a single package. For example, a memory module for a mobile system includes memory chips and a memory controller in a single package where such components are vertically stacked.

However, such vertical stacking of the memory package and the controller leads to a height increase of the memory package, especially when the size of the memory package increases. This increase of height may prevent electronic systems from being made thinner.

Accordingly, there has been a need for an improved memory package to be accommodated in ever-thinning electronic systems.

SUMMARY

The present inventive concept provides a stack semiconductor package having a board mold into which the electric circuits and controller chips are built. The present inventive concept also provides a method of manufacturing the stack semiconductor package.

According to an exemplary embodiment of the inventive concept, a stack semiconductor package includes a first semiconductor device having a first electrode pad at an active face thereof. A board mold covers the first semiconductor device. A first conductive plug is connected to first and second contact units. The first conductive plug penetrates the board mold and the first and the second contact units are disposed at first and second faces of the board mold respectively. The first face is opposite to the second face. A second conductive plug is disposed in the board mold and connected to the first electrode pad. A second semiconductor device is arranged on the first face of the board mold and has a second electrode pad making contact with the first contact unit through an interconnection. A sealing member is disposed on the board mold, covering the second semiconductor device.

According to an exemplary embodiment of the inventive concept, to manufacture a stack semiconductor package, a board mold is formed to cover a first electrode of a first semiconductor. The board mold has first and second faces and the first electrode pad faces the second face opposite to the first face. A second recess and a second opening is formed from the second face, The second opening exposes the first electrode pad of the first semiconductor device. A first recess and a first opening are from the first surface. The first opening connects the first and the second recesses. A first contact unit at the first face and a second contact unit at the second face are formed by filling the first opening and the first and second recesses with a conductive material. A second semiconductor device is arranged on the first face. An interconnection is formed between the second semiconductor device and the first contact unit. A sealing member covers the second semiconductor device.

According to an exemplary embodiment of the inventive concept, to manufacture a stack semiconductor package, a board mold covers a first semiconductor. The board mold includes a first face and a second face opposite to the first face. An active surface of the first semiconductor faces the second face. A first opening is formed in the board mold from the second surface. The first opening is disposed on the first semiconductor. A second opening penetrates the board mold from the first surface. A conductive metal layer fills the first and the second openings using an electroless plating method. A plurality of semiconductor devices is stacked on the first face of the board mold.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
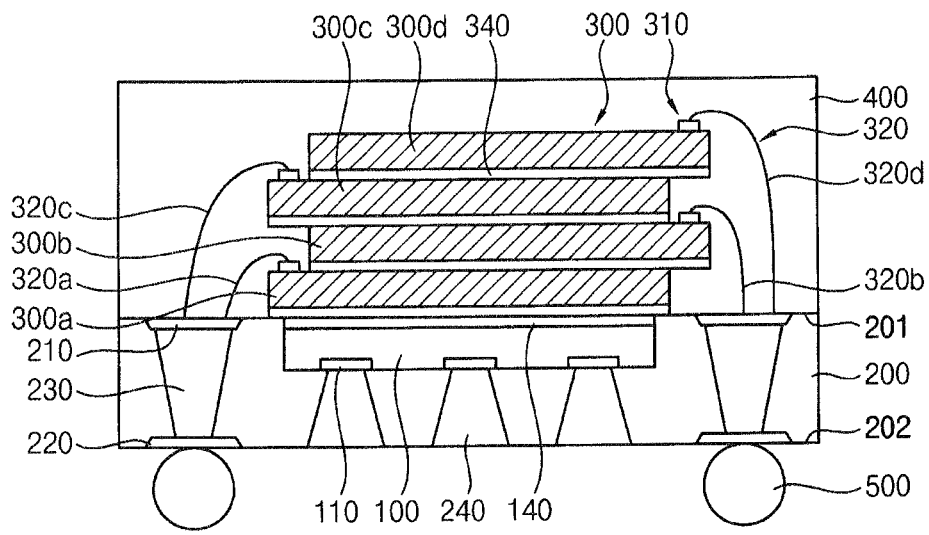
FIG. 1 is a cross-sectional view of a stack semiconductor package in accordance with an exemplary embodiment of the present inventive concept.

Exemplary embodiments of the inventive concept will be described below in more detail with reference to the accompanying drawings. However, the inventive concept may be embodied in different forms and should not be construed as limited to the embodiments set forth herein. Rather, these exemplary embodiments are provided so that this disclosure will be thorough and complete and will fully convey the inventive concept to those skilled in the art. In the drawings, the thickness of layers and regions may be exaggerated for clarity. Like reference numerals may refer to the like elements throughout the specification and drawings.

FIG. 1 is a cross-sectional view of a stack semiconductor package in accordance with an exemplary embodiment of the present inventive concept. In FIG. 1, the stack semiconductor package 100 may be used for a mobile device. However, the stack semiconductor package would be applied for various electronic systems.

Referring to FIG. 1, the stack semiconductor package 1000 includes a first semiconductor device 100 and a board mold 200. The first semiconductor device includes a first electrode 110 formed on an active face of the semiconductor device 100. The active face is referred to a surface of the semiconductor device 100 where active devices such as transistors are formed.

The board mold 200 covers the first semiconductor device 100. The active face of the first semiconductor is covered with the board mold 200 and is arranged to face a front surface F or a second face 202 of the board mold 200. The front surface F is used interchangeably with the second face 202.

The stack semiconductor package 1000 further include a first contact unit 210 at the first face 201, a second contact unit 220 at the second face 202, a first conductive plug 230 connecting the first and second contact units 210 and 220 and a second conductive plug 240 connected to the first electrode pad 110. The first conductive plug 230 penetrates the board mold 200.

The stack semiconductor package 1000 further includes a second semiconductor device 300 disposed on the first face 201 of the board mold 200. The second semiconductor device includes a plurality of semiconductor devices that include a second electrode pad 310. The second electrode pad 310 is in contact with the first contact unit 210.

The stack semiconductor package 100 includes a sealing member 400 disposed on the board mold 200, securing the second semiconductor device 300 to the board mold 200, thereby sealing the second semiconductor device 300 from the environment.

The first semiconductor device 100 may include various semiconductor chips and packages. For example, the first semiconductor device 100 may include a single memory device, a single logic device a processor having the memory device, a logic device, and/or a system in package (SIP). This SIP may include a plurality of integrated circuit chips that are packaged into a single electronic system. For example, the processor of the memory device and the logic device may be packaged in a horizontal way or may be packaged in a vertical way. The configurations of the stack processor may be limited by physical characteristics of the board mold 200 such as a thickness of the board mold 200 and signal interferences in the board mold 200.

According to an exemplary embodiment, the first semiconductor device 100 may include a controller chip for controlling the second semiconductor device 300 such as a memory device. The first semiconductor device 100 may be electrically connected to an external device through the first electrode pad 110.

The board mold 200 covers the first semiconductor device 100 and surrounds an interconnection structure that may be connected to the first and the second semiconductor devices 100 and 300.

The board mold 200 may include a mold-friendly material. The board mold 200 is combined with the first semiconductor device 100, covering the first semiconductor device, through a mold process. For example, the interconnection structure may be formed inside of the board mold 200 through as a molded interconnect device (MID). In addition, the board mold 200 may have stiffness and rigidity sufficient for supporting the second semiconductor device 300, and thus may function as a circuit board for the second semiconductor device 300.

The interconnection structure may be provided in the board mold 200 through an MID process, and thus no additional member may be provided with the board mold 200 when the board mold 200 may function as the circuit board. Further, the first semiconductor device 100 may be accommodated in the board mold 200, thereby preventing the increase of the thickness of the stack semiconductor package 1000 caused by the first semiconductor device 100.

For example, the board mold 200 may include an insulating resin having electromagnetic compatibility (EMC) and electromagnetic interference (EMI) characteristics as well as having sufficient mechanical rigidity and stiffness together with good moldability. For example, the board mold 200 may include an epoxy mold compound.

The first semiconductor device 100 may be arranged such that an active face of the semiconductor device 100 having the first electrode pad 110 faces toward the second face 202 of the board mold 200. A rear face opposite to the active face of the first semiconductor device 100 may face upward. As described hereinafter, the second semiconductor device 300 may be positioned over the rear face of the first semiconductor device 100, and thus the first and the second semiconductor devices 100 and 300 may be electrically connected with each other without any other interconnections such as re-directional wirings. In addition, the second semiconductor device 300 may also be communicated with an external device through the second plug 240 that may be exposed through a bottom surface of the stack semiconductor package 1000, thereby improving the stability and reliability of signal transfer.

The board mold 200 may include an interconnection structure therein. That is, the first contact unit 210 may be provide at the first face 201 and may be connected to the second semiconductor device 300 and the second contact unit 220 may be provided at the second face 202 and may be connected to the external terminal 500 for communicating with an external devices. In addition, the first conductive plug 230 may penetrate through the board mold 200 so that the first contact unit 210 and the second contact unit 220 may be connected with each other via the first conductive plug 230. The second conductive plug 240 may also penetrate through the board mold 200 so that the second conductive plug 240 may be connected to the first electrode pad of the first semiconductor device 100 and may be exposed through the second face of the board mold 200.

According to an exemplary embodiment, the first contact unit 210 may include a plurality of contact pads that may be arranged in a line at a peripheral portion of the first face 201. The number of the contact pads may be varied in accordance with the number of the stack unit components of the second semiconductor device 300. Thus, when the second semiconductor device 300 may include a plurality of integrated circuit chips, each of the IC chips may be individually connected to the respective contact pad.

The contact pads may be arranged at the peripheral portion of the first face 201 of the board mold 200 and the second semiconductor device 300 may be arranged at a central portion of the first face 201. However, various arrangements of the first contact unit would not be limited thereto, and may be available according to the configuration of the second semiconductor device 300. For example, when the second semiconductor device 300 may include a plurality of the IC chips that may be arranged at the peripheral portion of the first face 201, the first contact unit 210 may be arranged at the central portion of the first face 201 of the board mold 200 in a line.

The second contact unit 220 may be arranged on the second face 202 opposite to the first face 201 of the board mold 200 and may make contact with the external terminal 500. For example, the second contact unit 220 may be shaped into a line extending on the second face 202. The shape and direction of the line-shaped second contact unit 220 may be varied in accordance with the contact convenience with the external terminal 500 and the connection convenience between an external module and the stack semiconductor package 1000.

The first and second contact units 210 and 220 may be connected with each other by the first conductive plug 230. When the first contact unit 210 may include a plurality of the contact pads that may be spaced apart by a same distance along a line, the first conductive plug 230 may be extended from each of the contact pads to the line-shaped second contact unit 220. In such a case, the second contact unit 220 may function as a common contact line commonly connected with the contact pads.

The first contact unit 210 may be connected to the second electrode pad 310 of the second semiconductor device 300 and also to the second contact unit 220. Then, the second contact unit 220 may be connected to the external terminal 500 that may be communicated with an external signal source (not illustrated). Accordingly, the second semiconductor device 300 may be connected to the external signal source via the first and the second contact units 210 and 220 and the first conductive plug 230 interposed between the first and the second contact units 210 and 220.

The second conductive plug 240 may be connected to the first electrode pad 110 and may be exposed through the second face 202 of the board mold 200. The second conductive plug 240 may be connected to the external signal source and/or the second contact unit 220 via additional interconnections. Thus, the first semiconductor device 100 may be communicated with the external signal source via the second conductive plug 240.

In an exemplary embodiment, the first conductive plug 230 may have an inverted shape of the second conductive plug 240 in a cross-sectional view. For example, the first conductive plug 230 may have a shape of a trapezoid whose width may decrease downward from the first face 201 to the second face 202. The second conductive plug 240 may have an inverted shape of that of the first conductive plug. The width of the second conductive plug 240 may decrease upward from the second face 202 to the first electrode pad 110. Such difference in shape of the first and the second plugs 230 and 240 may be caused by a sequence of manufacturing process. A first opening for the first conductive plug 230 may be formed in a direction from the first face 201 to the second face 202 of the board mold 200 and a second opening for the second conductive plug 240 may formed in a reverse direction from the second face 202 to the first face 201 of the board mold 200. The process sequence will be explained in detail referring to FIGS. 3A to 3K.

The first and the second contact units 210 and 220 and the first and the second conductive plugs 230 and 240 may be simultaneously formed in a same process and may include a conductive material such as a low-resistive metal. The low-resistive metal may include copper (Cu), aluminum (Al), nickel (Ni), tungsten (W), titanium (Ti) and/or tantalum (Ta). These may be used alone or in combinations thereof. The low-resistive metal may be deposited onto the board mold 200 by an electroless plating process. However, when the conductive material may include a polysilicon and a metal silicide, the first and the second contact units 210 and 220 and the first and the second conductive plugs 230 and 240 may also be formed by a deposition process and a planarization process.

The first and the second contact units 210 and 220 and the first and the second conductive plugs 230 and 240 may be arranged inside of the board mold 200 so that the first semiconductor 100 and the second semiconductor 300 may be electrically connected with each other by the wiring structures 210 to 240, and thus the wiring structures in the board mold 200 may function as a molded interconnection device.

For example, the first semiconductor device 100 may face down in the board mold 200 and thus the first electrode pad 110 on the active face of the first semiconductor device 100 may face the second face of the board mold 200. The second conductive plug 240 making contact with the first electrode pad 110 may be directly exposed to the surrounding environment through the second face 202 of the board mold 200. Therefore, the first semiconductor device 100 may be directly connected to the external signal source without any re-directional wiring, thereby improving the stability and speed of the signal transfer between the first semiconductor device and the external signal source.

The second semiconductor device 300 may include at least one IC chip. For example, the second semiconductor device 300 may include a stack system package having a single logic chip and a plurality of memory chips, a stack memory package having a plurality of memory chips and a single memory chip. In addition, the second semiconductor device 300 may also include various types of package modules such as a package on package (POP), a system in package (SIP) and a wafer level package.

The second semiconductor device 300 may be connected to the first contact unit 210 by various bonding structures in accordance with the package type thereof. For example, the second electrode pad 310 of the second semiconductor device 300 may be connected to the first contact unit 210 by a bonding wire. Alternatively, the second electrode pad 310 may also be connected to the first contact unit 210 by a penetration electrode and a re-directional wiring.

According to an exemplary embodiment, the second semiconductor device 300 may include first to fourth memory chips 300a to 300d that may be sequentially stacked on the first face 201 of the board mold 200. The second electrode pad 310 of each memory chip may be individually connected to the first contact unit 210 through the first to fourth bonding wires 320a to 320d. In such a case, the first contact unit 210 may include a plurality of contact pads corresponding to the bonding wires 320a to 320d, respectively. The contact pads of the first contact unit 210 may be arranged in a line and spaced apart by the same distance, and each of the contact pads may be commonly connected to the line-shaped second contact unit 220.

The memory chips 300a to 300d may be vertically stacked so that the active face of each memory chip may face upward in the stack semiconductor package 1000, and the neighboring memory chips may be secured to each other by an adhesive 340. For example, the memory chips 300a to 300d may be stacked on the board mold 200 so that a peripheral portion of a lower memory chip may not be covered with an upper memory chip. Thus, the memory chips 300a to 300d may be vertically arranged on the first face 201 and the peripheral portions of the stacked memory chips 300a to 300d may be alternately protruded leftwards or rightwards in a vertical direction, exposing the second electrode pad 310 of each memory chip. That is, a first memory chip 300a may be arranged in parallel with a third memory chip 300c and a second memory chip 300b may be arranged in parallel with a fourth memory chip 300d in the second semiconductor device 300. As a result, the first and the third memory chips 300a and 300c may be connected to the contact pads of the first contact unit 210 that may be arranged at a left portion of the second semiconductor device 300 and the second and the fourth memory chips 300b and 300d may be connected to the contact pads of the first contact unit 210 that may be arranged at a right portion of the second semiconductor device 300.

The sealing member 400 may be arranged on the board mold 200 to cover the second semiconductor device 300 and the bonding wire 320. The second semiconductor device 300 and the bonding wire 320 may be secured to the board mold 200 and may be protected from the surrounding environments.

The sealing member 400 may include the same material as that of the board mold 200, thereby minimizing a thermal deformation of the stack semiconductor package 1000. In such a conventional case that the first semiconductor device is built in an inside of a conventional PCB and the second semiconductor device on the PCB is sealed from surroundings by the sealing member, the thermal expansion ratios of the PCB and the epoxy resin are different from each other and thus the epoxy resin may be separated from the PCB by heat generated from the first and the second semiconductor devices, especially bending the PCB. However, according to the stack semiconductor package 1000 according to an exemplary embodiment of the present inventive concept, the sealing member 400 and the board mold 200 may include a same material so that there is no difference in having a thermal expansion coefficient between the sealing member 400 and the board mold 200. Such uniform thermal expansion coefficient may minimize the deformation or torsion of the board mold 200 to be caused when a thermal expansion coefficient of the board mold 200 is different from that of the sealing member 400. The sealing member 400 may include an epoxy mold compound having good EMC and EMI characteristics as used for the board mold 200.

An external terminal 500 may be further provided with the stack semiconductor package 1000 and thus the stack semiconductor package 1000 may be communicated with the external signal source via the external terminal 500. For example, the external terminal 500 may include a solder ball making contact with the second contact unit 220 of the board mold 200 on the second face 202 of the board mold 200. The solder ball may include lead (Pb) and/or tin (Sn). The solder ball may have a round shape on the line-shaped second contact unit 220 by a reflow process. An under-barrier metal (UBM) layer (not shown) and a buffer layer (not shown) may be further interposed between the solder ball and the second contact unit 220 and an under-fill resin (not shown) may be further interposed between the solder ball and the second face 202 of the board mold 200, thereby improving the mechanical stability of the solder ball.

Additional bump structures (not shown) for connecting the second conductive plug 240 to the external signal source may be further provided with the stack semiconductor package 1000. In addition, additional pattern structures may be further provided with the stack semiconductor package 1000, thereby connecting the second conductive plug 240 to the external terminal 500 or the second contact unit 240.

When the second conductive plug 240 may be connected to the external signal source by the bump structure, an additional central process unit (not shown) may be provided with the external signal source and the signals from the first semiconductor device 100 may be processed in the additional central process unit. For example, when the first semiconductor device 100 may include a controller chip for operating the stack memory chips of the second semiconductor device 300, control signals of the first semiconductor device 100 may be transferred to the additional central process unit of the external signal source via the second conductive plug 240 and the bump structure and some digital data may be transferred to the memory chips of the second semiconductor device 300 via the external terminal 500 in accordance with the control signal. Further, the operation state of the memory chips of the second semiconductor device 300 may be transferred to the controller chip via the central process unit and the bump structure.

According to an exemplary embodiment, the second conductive plug 240 may be connected to the second contact unit 220 through additional re-directional wires. An electrical communication between the controller chip 100 and the memory chips 300 may be performed through the second contact unit 240 and the electrical communication between the controller chip 100 and an external signal source may be performed through the external terminal 500.

According to an exemplary embodiment, the stack semiconductor package 1000 may include the first semiconductor device 100 such as a controller chip and the interconnection structure 210 to 240 buried in the board mold 200, which do not increase the overall thickness of the stack semiconductor package 1000. As a result, such buried structure may allow an electronic system including the stack semiconductor device to be thinner. Further, the first semiconductor device 100 may be arranged such that the active face of the first semiconductor device 100 may face down and thus the first semiconductor device 100 may be directly connected to the external signal source without any re-directional wiring and may increase the stability and reliability of signal transfer of the first semiconductor device.

According to an exemplary embodiment, the memory chips stacked in the second semiconductor device 300 may be connected, not limited to by the adhesive 340, with each other by various interconnections.

Figure 2:
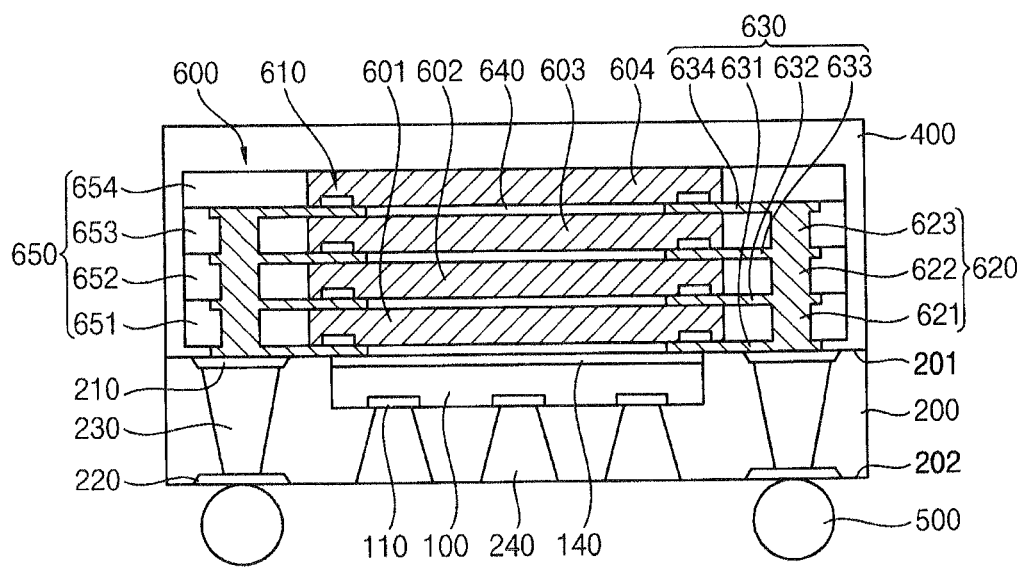
FIG. 2 is a cross-sectional view of a stack semiconductor package in accordance with an exemplary embodiment of the present inventive concept.

FIG. 2 is a cross-sectional view of a stack semiconductor package in accordance with an exemplary embodiment of the present inventive concept. In FIG. 2, the stack semiconductor package 2000 has substantially the same structure as that of the stack semiconductor package 1000 shown in FIG. 1 except for the structure of the second semiconductor device. In FIG. 2, the same reference numerals denote the same elements in FIG. 1, and thus the detailed descriptions of the same elements will be omitted.

Referring to FIG. 2, the stack semiconductor package 2000 in accordance with an exemplary embodiment of the present inventive concept may include a second semiconductor device 600 on the board mold 200 having the first semiconductor device 100. The active face of the second semiconductor device may face downward.

For example, first to fourth memory chips 601 to 604 may be stacked on the first face 201 of the board mold 200. The active face of each memory chip may face downward toward the first face 201 and the neighboring memory chips may be adhered to each other by an adhesive 640. For example, the adhesive 640 may be located at a central portion of the boundary area of the neighboring memory chips and thus the second electrode pad 610 of each memory chip may be exposed to a gap space between the neighboring memory chips at a peripheral portion of each memory chip.

A re-directional wiring pattern 630 may be arranged in the gap space and the second electrode pad 610 may make contact with the re-directional wiring pattern 630 in the gap space. Each of the memory chips 601 to 604 may be enclosed by respective support unit 651 to 654 (referred to as support unit in a whole and designated as a reference numeral 650) and the re-directional wiring pattern 630 may be extended to the respective support unit 651 to 654. The re-directional wiring pattern 630 on each support unit 651 to 654 may be vertically connected to each other by first to third via contacts 621 to 623. The via contacts 621 to 623 may be overlapped in a vertical direction and may form a via structure 620 making contact with the first contact unit 210 of the board mold 200.

The second semiconductor device 600 may be secured to the board mold 200 by the sealing member 400 and may be protected from the surrounding environments by the sealing member 400.

According to an exemplary embodiment, the second semiconductor device 600 may be arranged such that the active face of the second semiconductor device 600 may each face downward as the first semiconductor device 100 does in the board mold 200. For example, the second semiconductor device 600 may include a wafer level package (WLP), which may facilitate the arrangement of the second semiconductor device of which active face may face downward. In manufacturing the WLP, a plurality of memory chips may be stacked on a wafer and may be sliced into pieces into a memory chip.

Hereinafter, a manufacturing method of a stack semiconductor package according to an exemplary embodiment of the inventive concept will be explained referring to FIGS. 3A to 3K. FIGS. 3A to 3K are cross-sectional views of a stack semiconductor package that is built under the manufacturing.

Figure 3A:
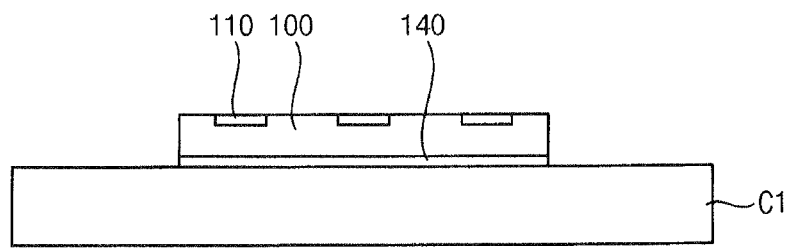
FIGS. 3A to 3K are cross-sectional views of a stack semiconductor package, in an intermediate manufacturing step of manufacturing the stack semiconductor package of FIG. 1.

Referring to FIG. 3A, a first semiconductor device 100 may be combined with a first carrier C1 in such a way that a first electrode pad 110 may face upward.

For example, the first semiconductor device 100 may be positioned on the first carrier C1. The first carrier C1 may include a hard plate. A preliminary adhesive (not shown) may be provided on a surface of the hard plate. The first carrier may be subject to an optical treatment or a heat treatment. The optical or heat treatment may melt the preliminary adhesive. The melted preliminary adhesive may serve to combine the first semiconductor device 100 to the surface of the hard plate. Residuals of the melted adhesive may be removed from the first carrier C1. The first semiconductor device 100 may be adhered to the first carrier C1 by an adhesive 140 interposed between the first carrier C1 and the first semiconductor device 100. Alternatively, the adhesive 140 may be pasted on the rear surface of the first semiconductor device 100 and the first carrier C1 and the first semiconductor device 100 may be adhered to each other by the adhesive 140.

The first carrier C1 may have good surface flatness. The first carrier C1 may have a high thermal expansion coefficient sufficient for preventing the first carrier C1 from deforming due to heat applied in combining the first semiconductor device 100 to the first carrier C1.

Figure 3B:
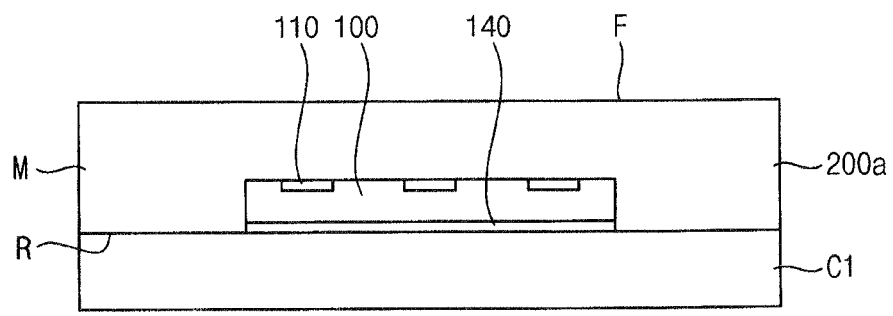

Referring to FIG. 3B, a mold layer M may be formed on the first carrier C1 to a thickness sufficient to cover the first semiconductor device 100. The mold layer M includes a front surface F and a rear surface R. The rear surface is in contact with the first carrier C1. The front surface is opposite to the front surface F.

For example, a preliminary mold layer (not shown) such as an insulating resin may be coated on the first carrier C1 to a thickness sufficient to cover the first semiconductor device 100 and a molding process may be performed to the preliminary mold layer formed on the first carrier C1. The mold layer M formed on the first carrier C1 may serve to secure the first semiconductor device 100 to the first carrier C1. The preliminary mold layer may be formed on the first carrier C1 by various coating processes including a printing process, a spin coating process and/or a jet injection process. Thus, a preliminary board mold 200a may be formed on the first carrier C1 by the molding process. The preliminary board mold 200a may be formed into a circuit board for the stack semiconductor package 1000, and thus may be formed into various shapes according to appliance requirements of the electronic system including the stack semiconductor package 1000. The front surface F of the preliminary board mold 200a may be open and the rear surface R of the preliminary board mold 200a may be in contact with the first carrier C1.

Figure 3C:
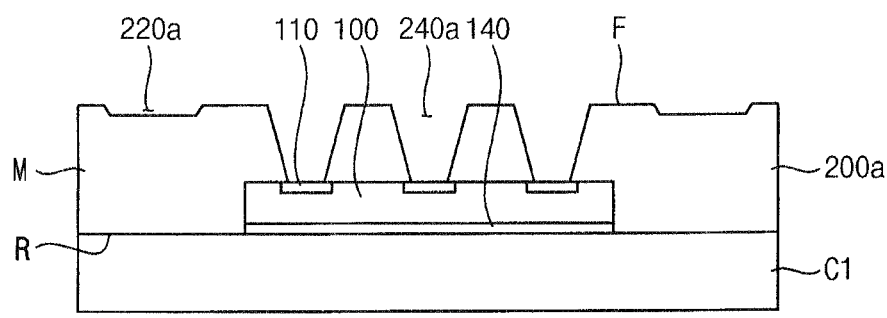

Referring to FIG. 3C, formed are a second recess 220a and a second opening 240a through which the first electrode 110 may be exposed.

For example, a laser drilling process may be performed onto the front surface of the preliminary board mold 200a and the mold layer M may be partially removed and the first electrode 110 may be exposed at a central portion of the preliminary board mold 200a. The front surface may be partially recessed at a peripheral portion of the preliminary board mold 200a to form the second recess 220a. Therefore, the second opening 240a may be formed at the central portion and the second recess 220a may be formed at the peripheral portion of the preliminary board mold 200a.

According to an exemplary embodiment of the inventive concept, the second recess 220a may include a line-shaped trench extending along the peripheral portion of the preliminary board mold 200a. The second opening 240a may include a plurality of openings through which a plurality of the pads of the first electrode pad 110 may be individually exposed. When the mold layer M is removed from the first carrier C1 by a laser, the mold layer M may be anisotropically removed so that widths the second recess 220a and the second opening 240a may decrease downward from the front surface of the mold layer M.

According to an exemplary embodiment, a mask pattern (not shown) may be formed on the front surface F of the preliminary board mold 200a. The mold layer M may be partially removed by an etching process using the mask pattern as an etching mask. The second opening 240a is formed to expose the first electrode pad 110 arranged at the central portion. The second recess 220a is recessed from the front surface F at the peripheral portion of the preliminary board mold 200a. The etching process may be controlled to form the shallow trench 220a at the peripheral portion. The deep opening 240a sufficient for exposing the first electrode 110 may be formed at the central portion of the mold layer M.

Figure 3D:
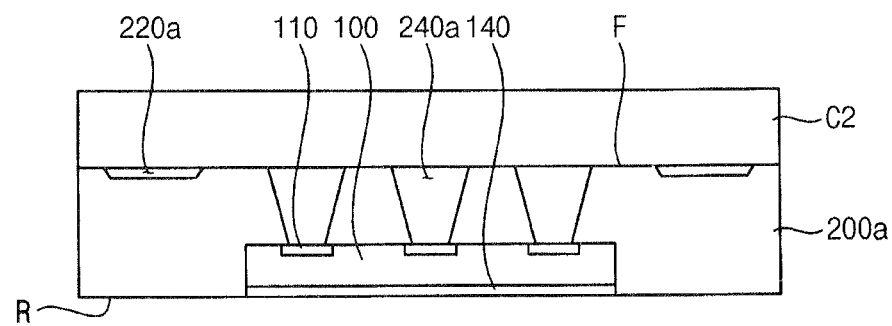

Referring to FIG. 3D, the first carrier C1 may be removed from the preliminary board mold 200a. The rear surface R of the preliminary board mold 200a may be exposed. A second carrier C2 may be combined with the preliminary board mold 200a. The preliminary board mold 200a may cover the front surface F.

For detaching the first carrier C1 from the preliminary board mold 200a, heat or light may apply to the boundary area between the first carrier C1 and the preliminary board mold 200a, and may dissolve the adhesive 140. Thus, the adhesive 140 may have a weak adhesive force to the extent that the first carrier C1 may be separated from the preliminary board mold 200a. Thus, the rear surface R of the preliminary board mold 200a may be exposed to surroundings.

The second carrier C2 may be combined with the preliminary board mold 200a in a method as used to combine the first carrier C1 with the first semiconductor device 100. For example, a preliminary adhesive (not shown) may be pasted on the front surface F of the preliminary board mold 200a, the second carrier C2 may be adhered to the front surface F of the preliminary board mold 200a by using heat or light.

Figure 3E:
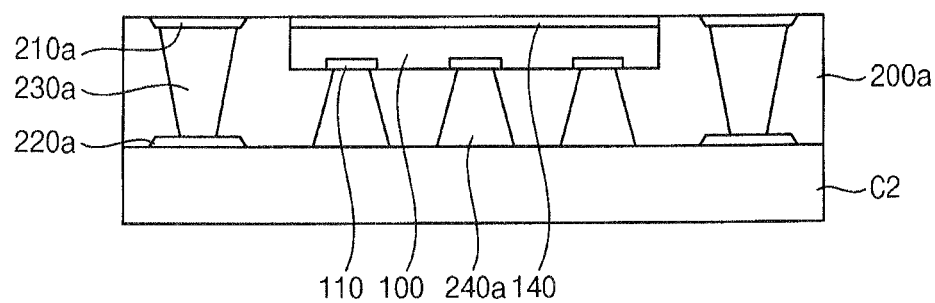

Referring to FIG. 3E, a first recess 210a and a first opening 230a are formed through the rear surface R of the preliminary board mold 200a. The first opening 230a communicates connects the second recess 220a and the first recess 210a.

For example, the preliminary board mold 200a combined with the second carrier C2 may be turned over in such way that the rear surface R may face upward and the second carrier C2 may face downward. Then, a laser drilling process may form the first opening 230a penetrating through the preliminary board mold 200a. The first opening 230a exposes the second recess 220a under the mold layer M. Then, the first recess 210a may be formed by enlarging an upper portion of the first opening 230a. As a result, the first recess 210a may be recessed to a predetermined depth from the rear surface R of the preliminary board mold 200a.

For example, the first opening 230a may be formed into a plurality of trenches that may be spaced apart from each other by the same gap distance in a line extending along the line-shaped second recess 220a. As a result, the first recess 210a may also be formed into a plurality of separated via holes that may be spaced apart from each other by the same gap distance along the line-shaped second recess 220a. While the second recess 220a may be formed into a linear and continuous line shape on the front surface F, the first recess 210a may be formed into a plurality of isolated island shapes extending along the second recess 220a. The trenches of the first opening 230a may extend to the second recess 220a from the via-hole of the first recess 210a, respectively and may be arranged in a line along the second recess 220a. Accordingly, the second recess 220a may be commonly communicated with the via-holes of the first recess 210a through the respective trench of the first opening 230a.

In such a case, the mold layer M may be removed by an anisotropic etching process due to the laser drilling process, the widths of the first opening 230a and the first recess 210a may also decrease downward from the rear surface R. Thus, the first recess 210a and the first opening 230a may have a reverse shape of the second recess 220a and the second opening 240a.

Figure 3F:
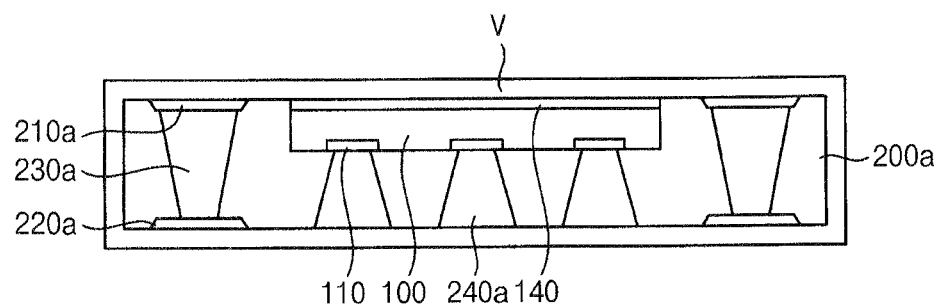

Referring to FIG. 3F, the second carrier C2 may be detached from the preliminary board mold 220a and the first and second recesses 210a and 220a and the first and the second openings 230a and 240a are exposed.

Then, inner surfaces of the first and second recesses 210a and 220a and the first and the second openings 230a and 240a may be coated with a transition metal such as palladium (Pd), and the preliminary board mold 200a coated with the transition metal layer may be immersed into a plating solution together with reducing agents.

Figure 3G:
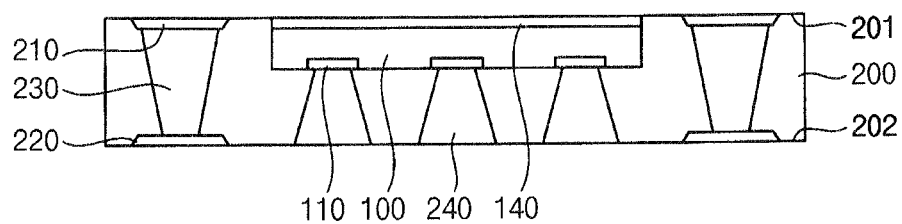

Referring to FIG. 3G, the first and second recesses 210a and 220a and the first and the second openings 230a and 240a may be filled up with conductive materials by an electroless plating process, thereby forming the first and the second contact units 210 and 220 in the first and the second recesses 210a and 220a and the first and the second conductive plugs 230 and 240 in the first and the second openings 230a and 240a. Thus, formed is a board mold 200 having the interconnection structure 210 to 240 and the first semiconductor device 100. The interconnection structure may include the contact units 210 and 220 and conductive plugs 230 and 240 that are formed by the electroless plating process.

For example, the electroless plating process may use a plating solution including plating metals such as copper (Cu), nickel (Ni), nickel (Ni)-phosphorus (P) alloy, and/or nickel (Ni)-boron (B) alloy. The preliminary board mold 200a may be immersed into the plating solution contained in a vessel V, and reducing agents such as formaldehyde and/or hydrazine may be supplied into the plating solution. The reducing agents react with ions of the plating metals to deposit the plating metals on the transition metal layer which is formed on the inner surfaces of the recesses 210a and 220a and openings 230a and 240a. The plating metals might not be deposited on front and rear surfaces F and R of the preliminary board mold 200a. The deposition of the plating metals may be maintained until the first and the second recesses 210 and 220 and the first and second openings 230 and 240a may be sufficiently filled with the plating metals to form the first and second contact units 210 and 220 and the first and the second conductive plugs 230 and 240.

After completing the electroless plating process, the preliminary board mold 200a may be pulled up from the vessel V. The board mold 200 may include an interconnect structure that the first contact unit 210 may be formed on a first face 201 and the second contact unit 220 may be formed on a second face 202. The first conductive plug 230 may penetrate through the board mold 200 and may be connected with the first and the second contact units 210 and 220 and the second conductive plug 230 may be exposed on the second face 202 and may be connected to the first electrode pad 110. A rear face of the first semiconductor device 100 may be exposed on the first face 201 of the board mold 200.

The electroless plating process may be performed through an auto-catalytic chemical reaction without any external electric power connected to the vessel V. In addition, the electroless plating process may efficiently deposit plating metals on the preliminary board mold 220a when the preliminary board mold 220a may include plastic and/or organic materials. Thus, the electroless plating process may form an interconnect structure such as the contact units 210 and 220 and the conductive plugs 230 and 240 in a preliminary board mold including insulating molding materials such as plastic and/or organic materials.

Figure 3H:
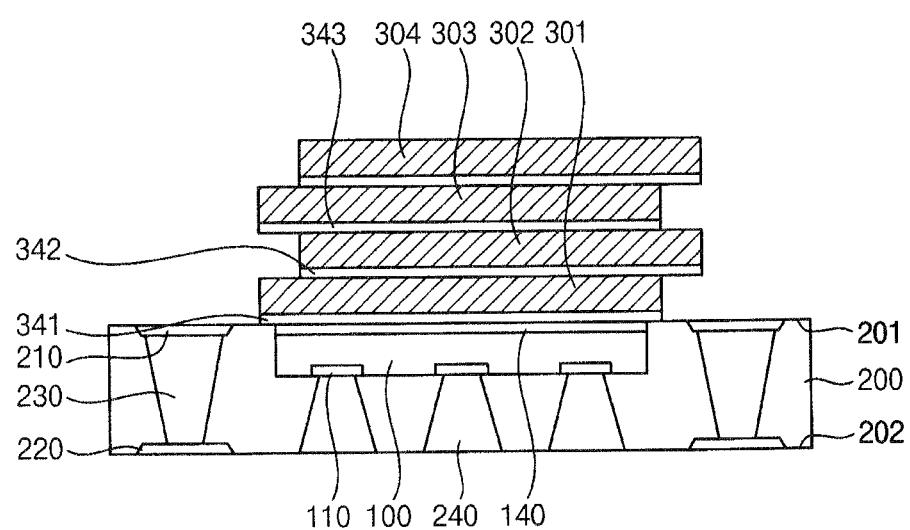

Referring to FIG. 3H, first to fourth memory chips 301 to 304 may be sequentially stacked on the first face 201 of the board mold 200. For example, a first adhesive 341 may be put on a rear face of the first memory chip 301 that are adhered to the rear face of the first semiconductor device 100 and/or the first face 201 of the board mold 200.

Then, a second adhesive 342 may be put on a rear surface of the second memory chip 302 and may combine the second memory chip 302 with the first memory chip 301. In a same way, the third memory chip 303 may be adhered to the second memory chip 302 and the fourth memory chip 304 may be adhered to the third memory chip 303, thereby forming a second semiconductor device 300 on the first face 201 of the board mold 200. The second semiconductor device 300 includes memory chips 301 to 304 stacked on the first face 201.

In stacking the memory chips 301 to 304, each memory chip may be partially covered by an upper memory chip so that each memory chip secures a wire connecting area by exposing a peripheral portion including a electrode pad 310. Thus, the electrode pad 310 of each memory chip may be uncovered by its upper memory chip for a bonding wire.

Figure 3I:
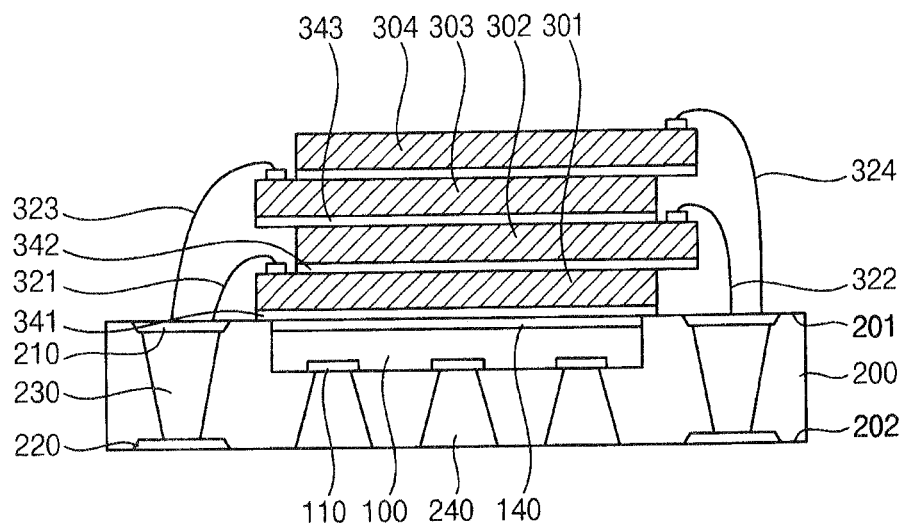

Referring to FIG. 3I, the second electrode pad 310 of each memory chip 301 to 304 may be connected to the first contact unit 210 by a bonding wire.

For example, the electrode pads 310 of the first and third memory chips 301 and 303 may be connected to the first contact unit 210 that may be arranged at a left side of the stacked memory chips of the second semiconductor device 300 through the first and the third bonding wires 321 and 323, respectively, and the electrode pads 310 of the second and fourth memory chips 302 and 304 may be connected to the first contact unit 210 that may be arranged at a right side of the stacked memory chips of the second semiconductor device 300 through the second and the fourth bonding wires 322 and 324, respectively.

A interconnection between the memory chips 301 to 304 and the first contact unit 210 is not limited to the bonding wire as explained above, but may be formed in various ways. For example, such interconnection may be formed using the re-directional wirings and the penetration electrodes as shown in FIG. 2.

According to an exemplary embodiment, the stack memory chip may include active chips such as a logic chip and a system package having both of the logic chip and the memory chip as well as the passive chips such as the memory chips.

Figure 3J:
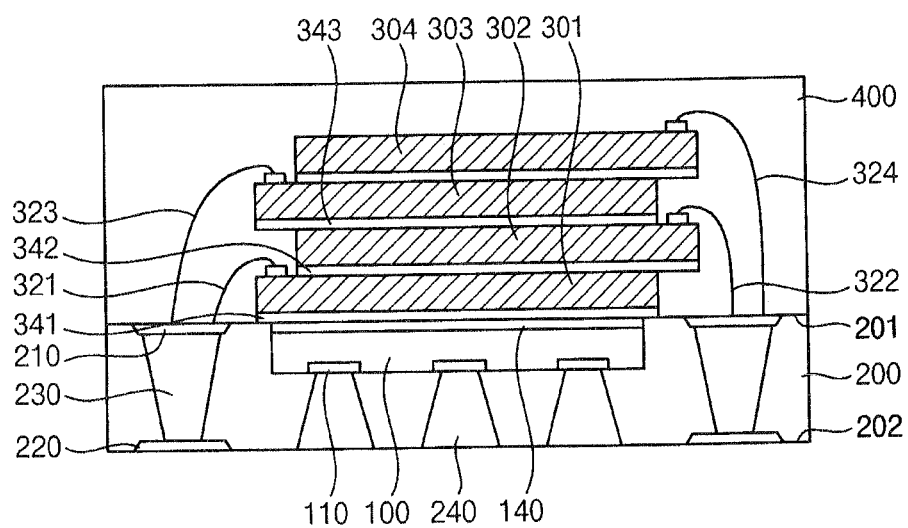

Referring to FIG. 3J, a sealing member 400 may be formed on the board mold 200 to cover the stack memory chips 301 to 304 and the bonding wires 321 to 324. Thus, the second semiconductor device 300 including the bonding wire 320 may be secured to the board mold 200 and may be protected from the surroundings.

The sealing member 400 may include substantially the same material as the board mold 200 or may include a material having a thermal expansion coefficient similar to that of the board mold 200. The thermal deformation of the stack semiconductor package 1000 may be minimized when the stack semiconductor package 1000 operates. For example, when the sealing member 400 and the board mold 200 have different thermal expansion coefficient, the stack semiconductor package 100 may have the thermal deformation when the stack semiconductor package 1000 operates. Such physical deformation may deteriorate the electrical connection between the second semiconductor device 300 and the first contact unit, thereby generating operational failures of the stack semiconductor package 1000.

Particularly, the sealing member 400 may have good insulation characteristics and electrical characteristics such as EMI and EMC characteristics to reduce electrical interference between the first and the second semiconductor devices 100 and 300.

According to an exemplary embodiment, the sealing member 400 may comprise the same material as the board mold 200 such as an epoxy mold compound.

Figure 3K:
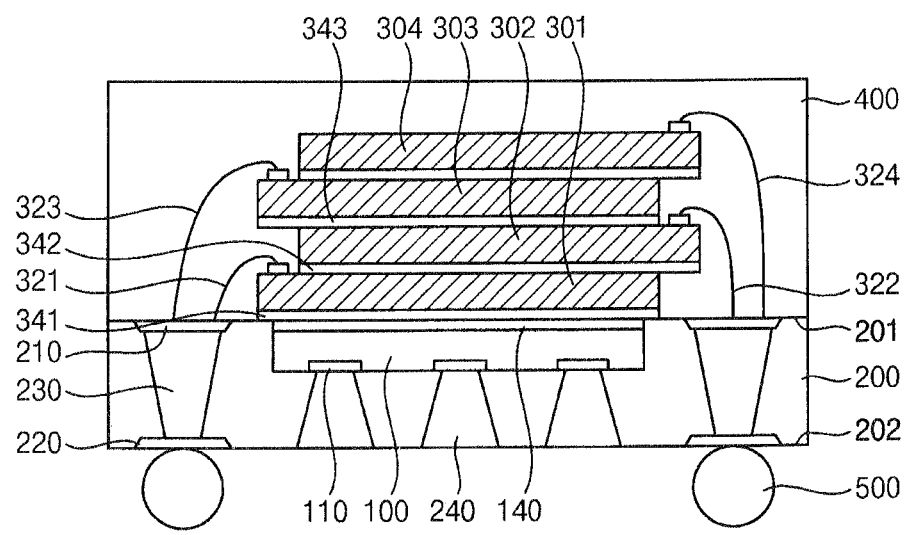

Referring to FIG. 3K, an external terminal 500 may be provided on the second face 202 of the board mold 200 in such a way that the second contact unit 220 may make contact with the external terminal 500.

For example, the external terminal 500 may include a solder ball. An insulation pattern (not shown) may be formed on the second face 202 in such way that the second contact unit 202 may be exposed through the insulation pattern and a UBM layer (not shown) and a buffer layer (not shown) may be formed on the insulation pattern. Then, a solder layer comprising lead (Pb) and tin (Sn) may be formed on the buffer layer and a reflow process may be performed on the solder layer.

The external terminal 500 may be electrically connected to an external signal source (not shown) and thus the stack semiconductor package 1000 may be communicated with the external signal source through the external terminal 500. The external signal source may include various configurations and modules in accordance with the electronic system including the stack semiconductor package 1000. In an exemplary embodiment, the stack semiconductor package 1000 may include a stack memory chip for a mobile device having a controller chip therein, and thus the electronic system including the stack semiconductor package 1000 may include a mobile system such as a smart phone and a tablet PC. In such a case, the stack semiconductor package 1000 may be provided as a memory module for the mobile system and an application processor (AP) may be provided as the external signal source for the mobile system.

A bump structure (not shown) may be further formed on the second conductive plug 240. Thus, the stack semiconductor package 1000 may be communicated with the external signal source through the bump structure as well as the external terminal 500.

According to an exemplary embodiment, an additional re-directional wiring (not shown) may be further formed on the second face 202 of the board mold 200 in such a way that the second conducive plug 240 and the second contact unit 220 may be connected to each other through the additional re-directional wiring. In such a case, both of the first and the second semiconductor devices 100 and 300 may be communicated with the external signal source through the external terminal 500.

According to an exemplary embodiment, the interconnection structure and the controller chip may be built in the molded board on which the stack memory chips may be mounted, thereby decreasing the thickness of the stack semiconductor package in a vertical direction. For example, the controller chip may be arranged in the molded board in such configuration that the active face of the controller chip may face downward and thus the electrode pad of the controller chip may be communicated with external signal source through the conductive plug that may be exposed on the bottom surface of the board mold without any additional bonding wires and re-directional wires, thereby increasing stability and reliability of signal transfer between the controller chip and the external signal source.

Figure 4:
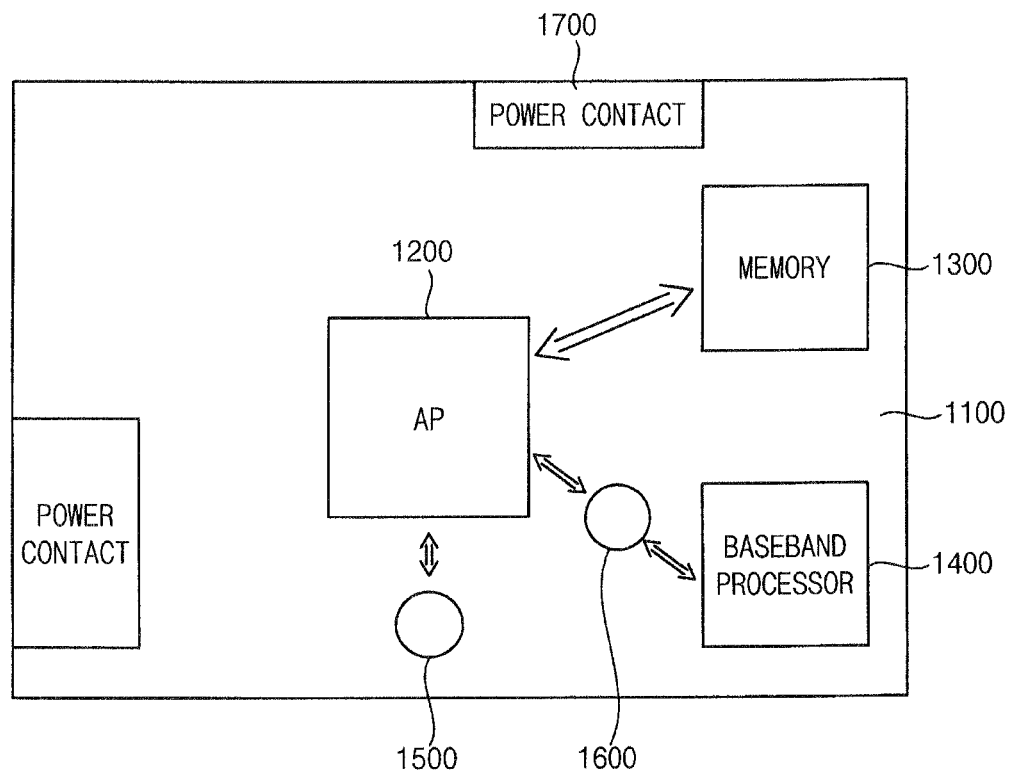
FIG. 4 is a block diagram of an electronic system including the stack semiconductor package in accordance with an exemplary embodiment of the present inventive concept.

FIG. 4 is a structural view of an electronic system including the stack semiconductor package as shown in FIG. 1. The electronic system may include a mobile system such as a smart phone and a tablet PC. The stack semiconductor package 1000 may include an application processor (AP). However, the stack semiconductor package may also be used for various other electronic systems.

Referring to FIG. 4, the electronic system 3000 in accordance with an exemplary embodiment of the present inventive concept may include a mother board 1100, an AP 1200 on the mother board 1100, a memory module 1300 communicating with the AP 1200, a baseband processor (BP) 1400, a controller 1500, a process interconnector 1600 for converting signals between the AP 1200 and the BP 1400 and a power supplier 1700.

The mother board 1100 may include a plurality of electronic circuits therein such as a printed circuit board (PCB) and the unit modules of the electronic system 3000 may be mounted on the mother board 1100. Thus, the unit modules of the electronic system 3000 may be secured to the mother board 1100 and may electrically be connected with one another via the electronic circuits of the mother board 1100. Various boards or substrates may be used as the mother board 1100 when the unit modules may be sufficiently secured to the board and electrically connected with one another.

The AP 1200 may include a central process unit (CPU) for operating and executing instructions, a first controller for controlling data communication between the CPU and the memory module 1300 and a second controller for controlling data communication between the CPU and other modules except for the memory module 1300.

The data stored in the memory module 1300 may be transferred to the AP 1200 and the data processed by the AP 1200 may be transferred to and stored in the memory module 1300.

In an exemplary embodiment, the memory module 1300 may include the stack memory package shown in FIG. 1 or 2. The stack memory chips may be mounted on the board mold that includes the controller chip for controlling the memory chips and the interconnection structure for communicating between the memory chips and the controller chip. The AP 1200 may be electrically connected to the controller chip of the first semiconductor device 100 and the stack memory chips of the second semiconductor device 300 through the external terminal 500 and the contact units 210 and 220 and conductive plugs 230 and 240 of the interconnection structure. The AP 1200 may access to the memory chips for storing data and for reading data through the controller chip 100. The controller chip 100 may operate the stack memory chips and control the cooling of each memory chip of the memory module 1300.

The vertical thickness of the memory module 1300 may be reduced, because the controller chip 100 is included in the board mold 200 of memory module 1300. As a result, the size of the electronic system 3000 including the memory module 1300 may also be reduced according to the thickness reduction of the memory module 1300. Further, the controller chip 100 may be arranged in the board mold 200 in such a way that the active face of the controller chip 100 may face downward and thus the controller chip 100 may be very closely connected to external signal sources without any additional re-directional wirings and penetration electrodes, thereby increasing stability and reliability of signal transfer between the controller chip 100 and the external signal sources.

The AP 1200 and the memory module 1300 may be horizontally arranged on the mother board 1100 or the memory module 1300 may be vertically stacked on the AP 1200 that is mounted on the mother board 1100 in accordance with the form factor of the electronic system 3000. However, the active face of the controller chip 100 may face downward in the memory module 1300 irrespective of whether such arrangement is the horizontal arrangement or the vertical stack of the memory module 1300. As a result, the memory module 1300 may be connected to the external signal sources through the second conducive plug 240 without any re-directional wiring. Accordingly, the data communication may be stably performed with high reliability between the AP 1200 and the memory module 1300.

A telecommunication between the electronic system 3000 such as the mobile system and a base station may be performed through the BP 1400, and thus various data such as voice data, text data and image data including moving pictures may be transferred from/into the electronic system 3000 via the BP 1400. The telecommunication data may be processed at the AP 1200 and then may be stored to the memory module 1300 or may be displayed on a display unit of the electronic system 3000. In such a case, the process interconnector 1600 may be arranged between the AP 1200 and the BP 1400 for mutually converting data signals for the AP 1200 and BP 1400.

The controller 1500 may include various audio codecs and an input controller for a touch panel. Thus, the AP 1200 may be controlled to process audio and video data and the panel touch by a user may be transferred to the AP 1200 as an input signal.

The power supplier 1700 may be connected to a battery in the electronic system 3000 and may supply electrical power to each module on the mother board 1100 from the battery.

According to an exemplary embodiment, the controller chip for the memory module and the interconnection structure for interconnecting the controller chip and the stack memory chips may be built in the board mold in a body, thereby decreasing the occupancy space of the memory module and thus downsizing the electronic system. In addition, the controller chip may be communicated with the AP through the interconnection structure in the board mold without any additional re-directional wiring, thereby increasing stability and reliability of the signal transfer between the memory module and the AP.

According to an exemplary embodiment, a stack semiconductor package includes the interconnection structure and the first semiconductor device such as the controller chip built in the board mold. The stack semiconductor package includes the second semiconductor device such as the stack memory chips mounted the board mold, thereby decreasing the occupancy space of the first semiconductor device and thus the vertical thickness of the stack semiconductor package. In addition, the active face of the first semiconductor device may be face downward in the board mold and thus the first semiconductor device may be connected to the external signal sources through the interconnection structure without any additional re-directional wirings, thereby improving the stability and reliability of the signal transfer between the first semiconductor device and the external signal sources. Further still, the second semiconductor device may be covered with the sealing member on the board mold and the sealing member may include a material of which the thermal expansion coefficient may be substantially the same as that of the board mold, thereby minimizing the deformation of the board mold due to the heat in operating the stack semiconductor package. Accordingly, the degree of freedom along a vertical direction or a thickness direction of the electronic system including the stack semiconductor package may be sufficiently increased due to the thickness reduction of the stack semiconductor package, thereby improving the vertical form factor of the electronic system including the stack semiconductor package.

The stack semiconductor package according to an exemplary embodiment of the inventive concept may be applied to various electronic systems including semiconductor devices and IC chips such as telecommunication systems and storage systems.

While the present inventive concept has been shown and described with reference to exemplary embodiments thereof, it will be apparent to those of ordinary skill in the art that various changes in form and detail may be made therein without departing from the sprit and scope of the inventive concept.

What is claimed is:

1. A stack semiconductor package comprising:
   a first semiconductor device having a first electrode pad at an active face thereof;
   a board mold covering the first semiconductor device;
   a first conductive plug connected to first and second contact units, wherein the first conductive plug penetrates the board mold and the first and the second contact units are disposed at first and second faces of the board mold respectively, wherein the first face is opposite to the second face and the active face of the first semiconductor device;
   a second conductive plug disposed in the board mold and connected to the first electrode pad;
   a second semiconductor device arranged on the first face of the board mold and having a second electrode pad making contact with the first contact unit through an interconnection; and
   a sealing member disposed on the board mold, covering the second semiconductor device,
   wherein the first conductive plug includes a shape of a trapezoid, and wherein the second conductive plug includes an inverted shape of the first conductive plug in a cross-sectional view.

2. The stack semiconductor package of claim 1, wherein the interconnection includes a plurality of bonding wires, wherein the second semiconductor device includes a plurality of memory chips stacked on each other, the plurality of memory chips each corrected to the first contact unit by the plurality of bonding wires, and wherein the first semiconductor device includes a controller chip for controlling the plurality of memory chips.

3. The stack semiconductor package of claim 1, wherein the interconnection includes a via structure and a re-directional wiring, the via structure disposed on the first contact unit and the re-directional wiring connecting the via structure and the second semiconductor device.

4. The stack semiconductor package of claim 3, wherein the second semiconductor device includes a wafer level package (WLP), the WLP including a plurality of memory chips that face towards the first semiconductor device.

5. The stack semiconductor package of claim 1, wherein the board mold and the sealing member include an electromagnetic compatibility (EMC) resin.

6. The stack semiconductor package of claim 1, further comprising an external terminal making contact with the second contact unit disposed at the second face of the board mold.

* * * * *